United States Patent [19]
Hakey et al.

[11] Patent Number: 5,532,518
[45] Date of Patent: Jul. 2, 1996

[54] ELECTRICAL CONNECT AND METHOD OF FABRICATION FOR SEMICONDUCTOR CUBE TECHNOLOGY

[75] Inventors: Mark C. Hakey, Milton; Steven J. Holmes, Burlington; John M. Wursthorn, Underhill Center, all of Vt.

[73] Assignee: International Business Machines Corporation, Armonk, N.Y.

[21] Appl. No.: 344,315

[22] Filed: Nov. 22, 1994

[51] Int. Cl.⁶ .......................... H01L 23/48; H01L 23/52; H01L 29/40
[52] U.S. Cl. ............................. 257/774; 257/773
[58] Field of Search ..................... 257/774, 773

[56] References Cited

U.S. PATENT DOCUMENTS

| | | | |
|---|---|---|---|
| 4,912,288 | 3/1990 | Atkinson et al. | 174/251 |
| 4,933,743 | 6/1990 | Thomas et al. | 257/774 |
| 5,220,490 | 6/1993 | Weigler et al. | 361/409 |
| 5,288,235 | 2/1994 | Sobhani | 439/67 |
| 5,293,005 | 3/1994 | Yamamura | 174/251 |

FOREIGN PATENT DOCUMENTS

408597 of 1922 Germany.

*Primary Examiner*—Stephen D. Meier
*Attorney, Agent, or Firm*—Heslin & Rothenberg

[57] ABSTRACT

A transfer metal configuration and fabrication process possessing increased probability of intersecting a transverse metallization level are presented, without employing an increase in actual metal thickness. The transfer metal is configured with a non-rectangular transverse cross-section such that the thickness of the electrical connect remains the same, but the transverse contact area of the exposed metal is increased. The entire transfer metal may have the same transverse cross-sectional configuration or have portions with different transverse configurations. If different configurations are employed, each portion of the transfer metal to be transversely intersected has the enhanced cross-sectional configuration. A tiered transverse configuration is presented which facilitates electrical connection of the transfer metal to a metal level on a face of a semiconductor cube structure.

23 Claims, 6 Drawing Sheets fig. 1 fig. 2 fig. 3 fig. 4 fig. 5 fig. 6 fig. 7 fig. 8 fig. 9a fig. 9b fig. 9c fig. 10a fig. 10b fig. 10c fig. 10d fig. 10e fig. 10f fig. 10g

ELECTRICAL CONNECT AND METHOD OF FABRICATION FOR SEMICONDUCTOR CUBE TECHNOLOGY

TECHNICAL FIELD

The present invention relates in general to high density electronic packaging for optimizing the number of circuit elements included in a given volume, and more particularly, this invention relates to an electrical connect configuration having increased probability of intersecting a transverse metallization level without requiring an increase in the actual metal thickness of the electrical connect or the dimensions of the transverse metallization level.

BACKGROUND ART

Semiconductor cube structures comprising three-dimensional arrays of integrated circuit chips have emerged as an important packaging approach having high density electronic interconnect. A typical three-dimensional cube structure consists of multiple integrated circuit chips adhesively secured together as a monolithic stack structure. A metallization pattern is often provided directly on at least one side surface of the monolithic stack structure for interconnecting the integrated circuit chips in the stack and for electrical connection of the stack to external circuitry. The metallization pattern can include both individual contacts and bussed contacts, along with multi-level wiring.

Current cube technology incorporates a final wafer metallization level, known as the transfer metal level, at wafer processing. For each integrated circuit chip, this transfer metal level connects selected chip contacts to the kerf region. Conventional cube processing requires that the transfer metal be subsequently covered by an insulator and an appropriate adhesive. The wafer is then diced, and the integrated circuit chips are stacked and laminated together to form the cube structure with the transfer metals of the chips aligned to at least one common face. This cube face is subsequently lapped and polished to expose the transfer metal leads. A layer of insulating material is deposited on the cube face and via T-connects are formed so as to connect to the transfer metal leads extending to the cube face. A metallization level is then formed on the cube face, electrically coupled to the via T-connects.

Lithographic requirements for forming the via T-connects should be such that there is sufficient alignment and overlay capability to "capture" the transfer metal leads extending to the common cube face without electrically shorting to buried kerf structures or to an adjacent integrated circuit chip in the stack. Unfortunately, due to process variations, "capturing" of transfer metal leads can often require a large via T-connect overlay requirement and a large via T-connect size requirement, both of which can carry an undesirably high via T-connect to die shorting probability. The present invention addresses these constraints of the existing art with a transfer metal having a transverse cross-sectional configuration that provides significant relaxation in via T-connect lithographic alignment, overlay and photoresist patterning requirements.

DISCLOSURE OF INVENTION

Briefly described, this invention comprises in a first aspect an electrical connect for an integrated circuit. The electrical connect comprises a unitary, elongate conductor having a flat conductor portion and a tiered conductor portion. The tiered conductor portion has a tiered transverse cross-sectional configuration. The flat conductor portion and the tiered conductor portion are electrically connected together to form the unitary, elongate conductor. The tiered conductor portion facilitates electrical connection to the flat conductor portion.

In another aspect, electrical connect is provided for an integrated circuit that comprises a unitary, elongate conductor composed of a conductive material of substantially constant thickness segregated into a first conductor portion and a second conductor portion. The first conductor portion has a first transverse cross-sectional configuration having a first horizontal width and a first vertical width. The first horizontal width is larger than the first vertical width. The second conductor portion has a second transverse cross-sectional configuration with a second horizontal width and a second vertical width. The second vertical width is greater than the first vertical width. The first conductor portion is disposed over an active region of the integrated circuit and the second conductor portion is disposed over an inactive region of the integrated circuit. The second conductor portion facilitates electrical connection to the first conductor portion disposed over the active region of the integrated circuit, and together the first conductor portion and the second conductor portion comprise the unitary, elongate structure.

In still other aspects, an integrated circuit chip and a semiconductor cube structure are provided which incorporate transfer metals, each of which comprises an electrical connect configured as outlined above.

In a further aspect, a method is provided for fabricating an electrical connect for an integrated circuit. The method includes the steps of: forming an insulator layer above the integrated circuit; forming an elongate opening in the insulator layer, the elongate opening having a first portion with a first transverse cross-sectional configuration and a second portion with a second transverse cross-sectional configuration, the first portion residing above an active region of the integrated circuit and the second portion residing above an inactive region of the integrated circuit; and forming a unitary, elongate conductor within the elongate opening in the insulator layer, the elongate conductor comprising a conductive material of substantially constant thickness and having a first conductor portion formed in the first portion of the elongate channel and a second conductor portion formed in the second portion of the elongate channel. The first conductor portion has the first transverse cross-sectional configuration of the first portion of the elongate channel, while the second conductor portion has a third transverse cross-sectional configuration formed from a portion of the second transverse cross-sectional configuration of the second portion of the elongate channel. The unitary, elongate conductor comprises the electrical connect.

To restate, this invention is a processing technique that affects the configuration of transfer metal in the kerf region to advantageously provide significant relaxation in via T-connect lithographic alignment, overlay and photoresist patterning requirements. The technique provides a general method for increasing the probability of intersecting two transverse levels of metal without increasing the surface area of either metal level. Further, via T-connect to transfer metal wiring overlay probability is enhanced without increasing the actual thickness of the transfer metal.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 1:
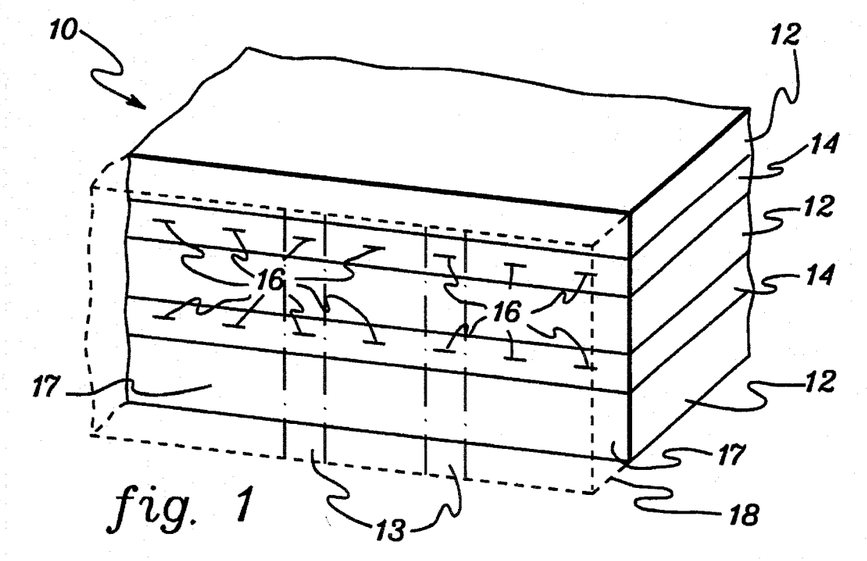
FIG. 1 is a partial perspective view of a semiconductor cube structure showing transfer metal leads exposed on a common face of the structure.

Fig. 1 is a partial perspective view of a semiconductor cube structure, generally denoted 10, comprising a plurality of stacked integrated circuit chips 12, each of which is separated from an adjacent chip by a layer of polyimide 14. Transfer metal leads 16, associated with each integrated circuit chip 12, are buried within the corresponding polyimide layer 14. The ends of transfer metal leads 16, shown exposed at a common face 17 of cube structure 10, are covered by an insulator layer 18 (depicted in phantom). As noted initially, a metallization layer 13 is typically provided on the common face of cube structure 10, and in particular, within insulator layer 18. Metal level 13 interconnects integrated circuit chips 12 in the stack and facilitates electrical connection of external circuitry to cube structure 10. This metallization level can include both individual contacts and bussed contacts, along with multi-level wiring.

As a specific example, bussed contacts 13 are shown interconnecting vertically aligned transfer metal leads 16 of different integrated circuit chips in the cube. To accomplish this, selected portions of insulator 17 must be removed during cube processing to expose appropriate transfer metal leads 16 for electrical coupling thereof to metallization 13, subsequently to be defined. Conventionally, this electrical coupling is accomplished through via T-connects, which are well known in the art. For example, reference U.S. Pat. No. 5,270,261, entitled: "Three Dimensional Multichip Package Methods of Fabrication," and U.S. Pat. No. 5,202,754, entitled: "Three-Dimensional Multichip Packages and Methods of Fabrication," both of which are commonly assigned to the same assignee as the present invention. Selective removal of insulator layer 18 is accomplished with use of a process window or overlay image to expose the transfer metal leads through photolithography. The inherent difficulty in alignment of the process window relative to the conventional transfer metal leads, however, has given rise to the present invention.

Figure 2:
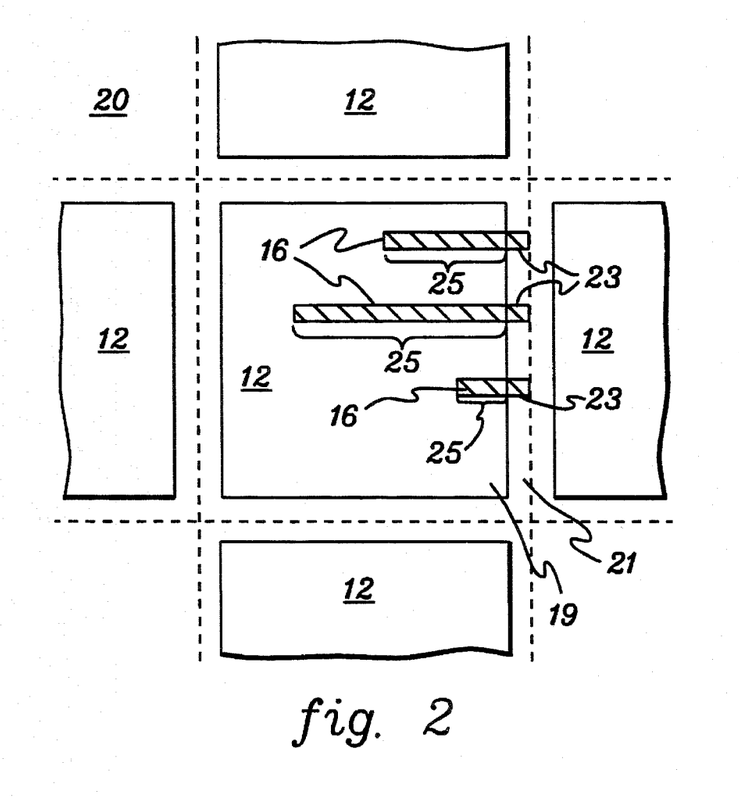
FIG. 2 is a partial plan view of a semiconductor wafer having multiple integrated circuit chips with representative transfer metal wiring shown disposed above the active and inactive regions of an integrated circuit chip.

FIG. 2 depicts a portion of a wafer 20 having multiple integrated circuit chips 12 formed therein. Three representative transfer leads 16 are shown disposed above one chip 12. Each transfer metal lead 16 connects between a contact pad (not shown), disposed in an active region 19 of the integrated circuit chip, and an inactive, kerf region 21 of the chip, which will comprise a chip edge upon dicing of wafer 20 along the phantom separation lines shown. Each transfer metal lead can therefore be divided into a first conductor portion 25 disposed above the active region of the integrated circuit chip 12 and a second conductor portion 23 disposed above the inactive region 21 of the chip. The first conductor portion and the second conductor portion are preferably simultaneously formed such that each transfer metal lead 16 comprises a unitary, elongate conductor. Conventionally, these transfer metal leads 16 comprise wirings of various length, each of which has a generally rectangular transverse cross-section at any point along its length.

Figure 3:
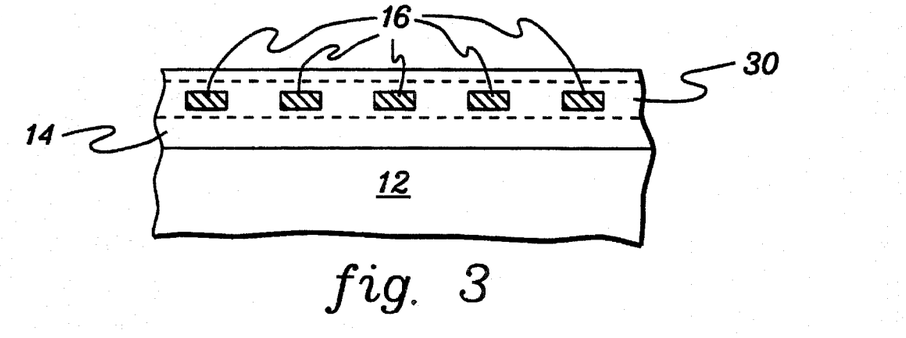
FIG. 3 is a partial elevational view of an integrated circuit chip with transfer metal leads exposed at an edge surface, such as along phantom line A–A of FIG. 2, and with an overlay image shown in phantom for use in subsequently forming metallization contacts.
Figure 4:
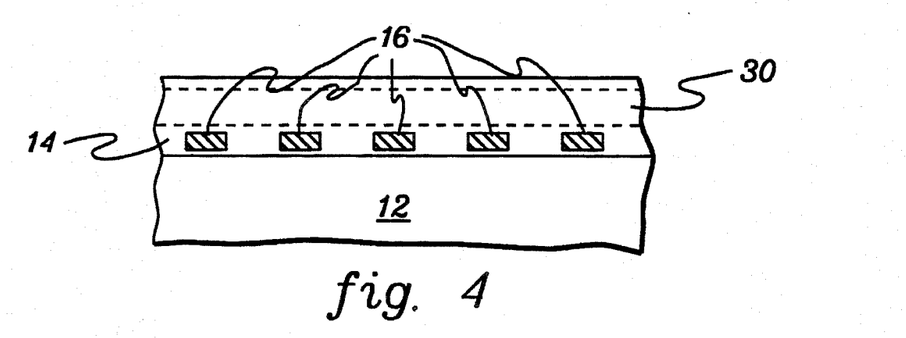
FIG. 4 is a partial elevational view of an integrated circuit chip with transfer metal leads exposed at an edge surface, and with the overlay image shown in phantom misaligned to the transfer metal leads.

An enlarged view of the edge surface of one integrated circuit chip 12 and associated insulator layer 14 is depicted in FIG. 3. In this figure, insulator layer 18 (FIG. 1) on the chip edge is not shown for clarity, however, an image overlay 30 is depicted in phantom to encompass the exposed transfer metal leads 16 extending to the edge surface. It should be understood that overlay image 30 will be formed in insulator layer 18 on the common face of the cube structure. In FIG. 3, overlay image 30 is depicted perfectly aligned to transfer metal leads 16 such that all leads will be exposed during cube processing. At the opposite extreme, FIG. 4 illustrates an example wherein image overlay 30 completely misses all transfer metal leads 16. This exists as a possibility because the thickness of each transfer metal lead is process dependent. For current technology, this thickness is approximately two microns. Thus, alignment of lead 16 with image overlay 30 can not be accomplished simply by making the leads thicker.

Further, the kerf region of an integrated circuit may contain a variety of structures, including test structures and alignment marks. These structures are at various heights above the silicon surface depending upon the level of wafer processing that forms them. From a cube processing perspective, an ideal kerf region would be a plane. This would insure that all exposed transfer metal leads on the lapped and polished cube face would be aligned regardless of lead position along the cube face or polish depth into the cube. FIGS. 3 & 4 are examples of this wherein all leads are horizontally aligned. In such a situation, the thickness of each transfer metal lead need only be sufficiently large to provide a necessary contact area and to account for any alignment, overlay and etch bias and tolerance.

Figure 5:
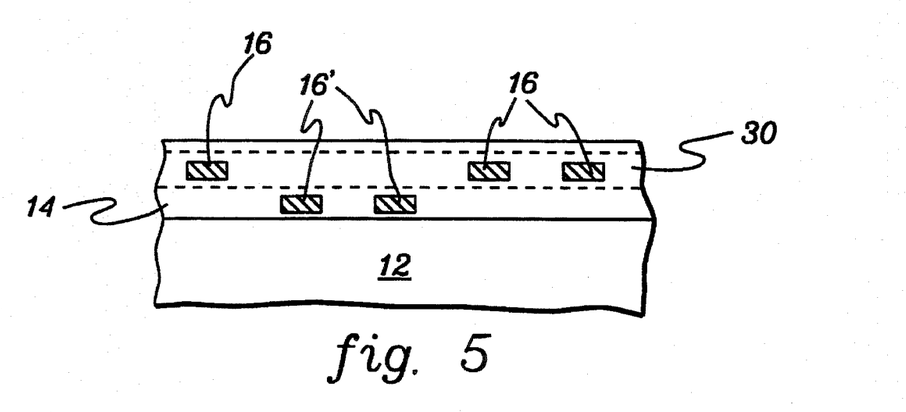
FIG. 5 is a partial elevational view of an integrated circuit chip with transfer metal leads exposed at an edge surface, and with the overlay image shown in phantom only partially aligned to the transfer metal leads.

Unfortunately, exposed metal leads are often misaligned because of height variation of various structures in the kerf region. FIG. 5 depicts this phenomenon wherein transfer metal leads 16' fall outside overlay image 30. This transfer metal misalignment possibility has conventionally been addressed by enlarging the overlay image such that the subsequently formed trench via contact (formed through overlay image 30) will have sufficient surface area to ensure capturing of the corresponding transfer metal lead. In practice, however, deviation from aligned positioning of the transfer metal leads is causing severe throughput, equipment and yield limitations on semiconductor cube technology.

Generally stated, the solution of the present invention is to increase the capture probability cross-section of each transfer metal lead rather than increasing the size of the overlay image or the resultant via T-connect. One embodiment of a transfer metal lead 40 in accordance with the present invention depicted in FIGS. 6 & 7. Again, each transfer metal lead 40 is assumed to comprise a unitary, elongate conductor (as depicted in FIG. 2) extending between an active region of the integrated circuit chip and a kerf region of the chip. In accordance with the invention, the elongate conductor has a transverse cross-sectional configuration designed to relax via T-connect lithographic alignment, overlay and photoresist patterning requirements.

Figure 6:
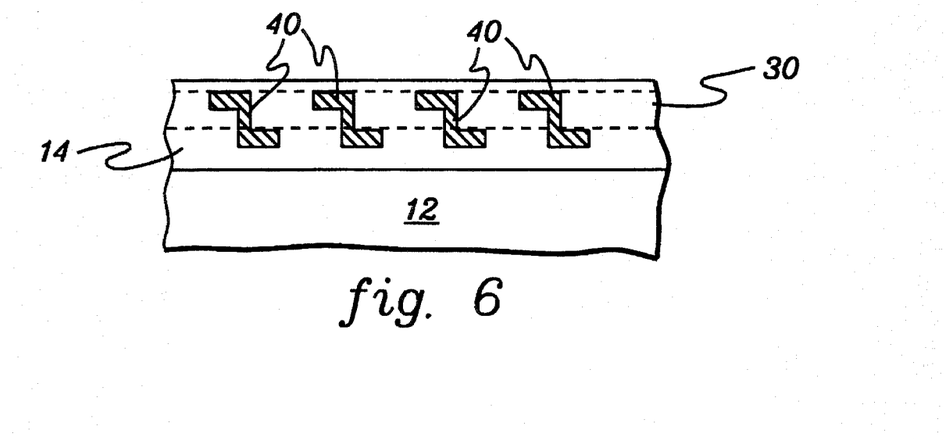
FIG. 6 is a partial elevational view of an integrated circuit chip with one embodiment of transfer metal leads configured in accordance with the present invention exposed at an edge surface, and with the overlay image shown in phantom aligned to the transfer metal leads.
Figure 7:
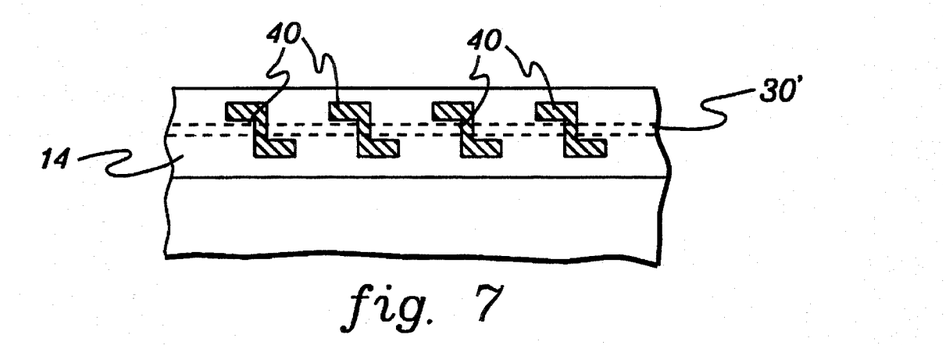
FIG. 7 is a partial elevational view of the integrated circuit chip of FIG. 6 showing a reduced overlay image requirement pursuant to the present invention.

In the embodiment shown, the cross-sectional configuration of at least the second portion of each elongate conductor comprises a tiered or Z-shaped configuration. The thickness of the metal lead remains the same, e.g., two microns, however the vertical extent or width of the transfer metal lead is significantly enhanced. Although not drawn to scale, a typical horizontal width (i.e., X-dimension length) for metal leads 40 would be 75–100 microns, and a preferred vertical width (i.e., Y-dimension length) would be 6–8 microns. Thus, a 3×–4×improvement in vertical contact area is provided at the exposed end of each unitary, elongate conductor.

The depicted cross-sectional configuration of metal leads 40 may extend for the entire length of the elongate conductor or, for example, only over kerf region 21 (FIG. 2) of the integrated circuit chip. In such a case, that portion of the elongate conductor over the active region may comprise a conventional rectangular-shaped transfer metal lead. However, as noted, the cross-sectional configuration of the elongate conductor may be patterned to achieve any specific desired advantage. Further, as shown in FIG. 7, the image overlay 30' may be significantly reduced pursuant to this invention since the probability of intersecting each transfer metal lead is significantly higher than with the standard rectangular-shaped metal leads disposed parallel to the respective integrated circuit chip.

In accordance with the invention, the transverse cross-sectional configuration of the exposed end of each transfer metal lead may vary. The unifying purpose in the various configurations is an increase in the vertical width or extent of the transfer metal lead when viewed in transverse cross-section without increasing the actual thickness of the metal itself. Perhaps the simplest embodiment of this concept would be a transfer metal lead having a twist such that the lead has a rectangular-shaped transverse cross-sectional configuration that is disposed parallel to an upper surface of the integrated circuit chip over an active region of the chip and that is oriented perpendicular to the upper surface of the integrated circuit chip over the kerf region.

If the transfer metal lead extends at a sufficient angle to the integrated chip to cover most of the region between chips (i.e., the thickness of insulator 14), then the probability of transfer metal capture would tend towards one even with an infinitesimally small image overlay and resultant via T-connect. Obviously, in practice there will necessarily be some limitation on the vertical extent of the transfer metal lead when viewed in transverse cross-section. In general, however, the present invention proposes to modify the transverse cross-section of the elongate conductor in order to present a larger target area for exposure, for example, by a process window during a subsequent processing step, without increasing the actual thickness of the metal layer comprising the elongate conductor.

Figure 8:
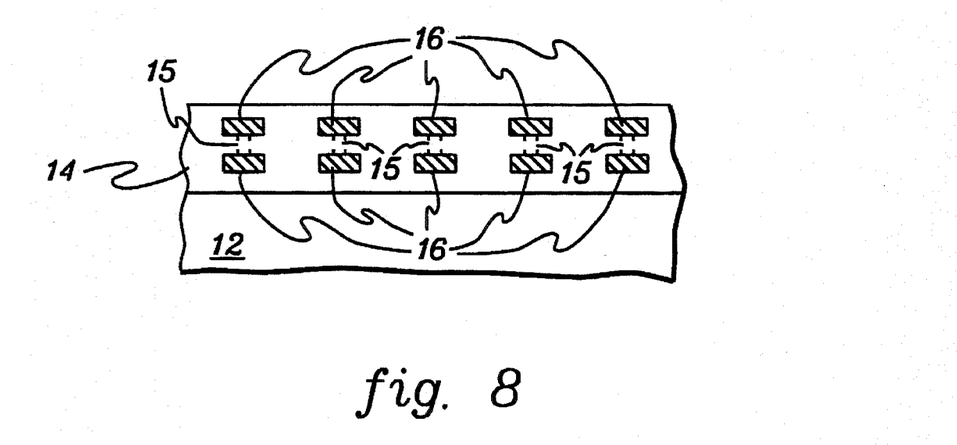
FIG. 8 is a partial elevational view of an integrated circuit chip with another embodiment of transfer metal leads configured in accordance with the present invention.

FIG. 8 depicts an alternate embodiment of an elongate conductor in accordance with the present invention. In this embodiment, the exposed transfer metal lead 16 is shown to comprise a layered or I-shaped structure wherein a lower set of conductors is electrically connected by metal vias 15 to an upper set of conductors. This alternative may have advantage in certain applications where wiring pitch in the cube structure must be reduced in comparison to the configuration of FIGS. 6 & 7. One skilled in the art can readily fabricate the structure of FIG. 8 through iterative via and metallization steps conducted, for example, prior to dicing the wafer into individual integrated circuit chips. Briefly explained, cross-sectional area of the transfer metal can be increased by processing through a first standard via and metallization sequence, then applying an additional insulator, opening a second via down to the initial metal level, and finally printing a second metal level directly over the first. Each second metal is offset from the corresponding first metal by the thickness of the insulator, which can be chosen such that an appropriate separation between metal layers is achieved. For example, 4–6 microns may be desirable with current technology.

Since the two metal features can be printed directly over each other, rather than offset horizontally as in the tiered cross-sectional configuration of FIGS. 6 & 7, increased wiring density at the cube face is attained. Whether this is desirable will depend upon the particular application. For example, logic cube structures may have a strong requirement for increased wiring density. In such a case, the cost of the additional masking levels may be justified by a performance advantage. Further, with this approach it may be possible to employ only one common face of the cube for wiring, whereas with another configuration it may be necessary to use multiple faces of the cube structure. The cost of cube processing would be diminished in such a case, while wafer processing would be more complex.

Figure 9A:
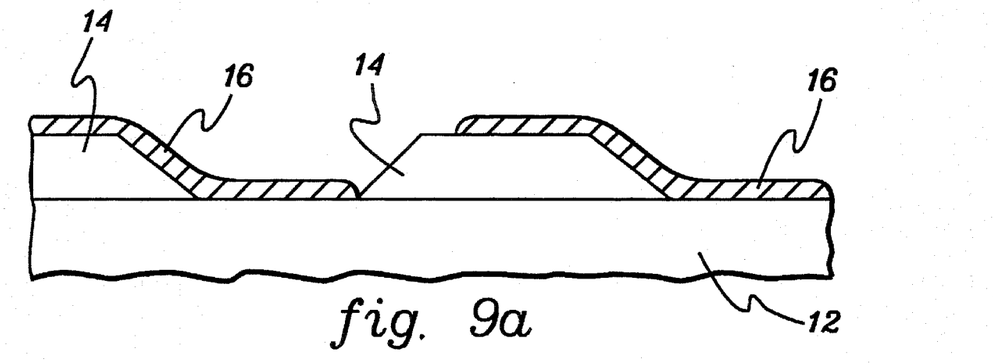
FIG. 9a is a partial elevational view of an integrated circuit chip having the transfer metal lead configuration of the structure of FIG. 6 formed from a sinusoidal metallization.
Figure 9B:
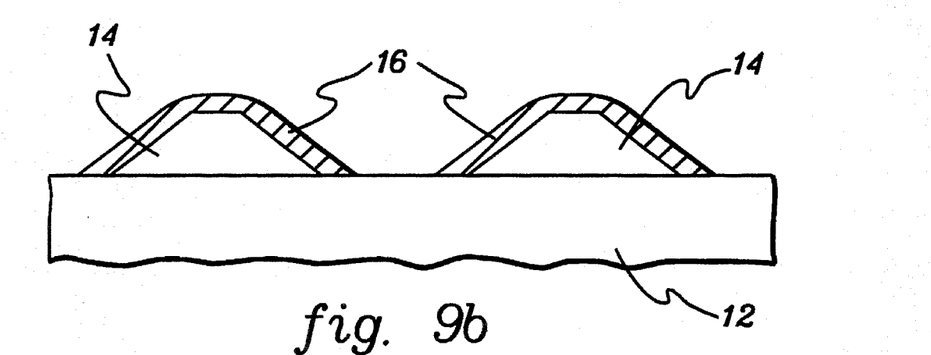
FIG. 9b is a partial elevational view of an integrated circuit chip with an alternate embodiment of transfer metal leads configured in accordance with the present invention, again formed from a sinusoidal metallization.
Figure 9C:
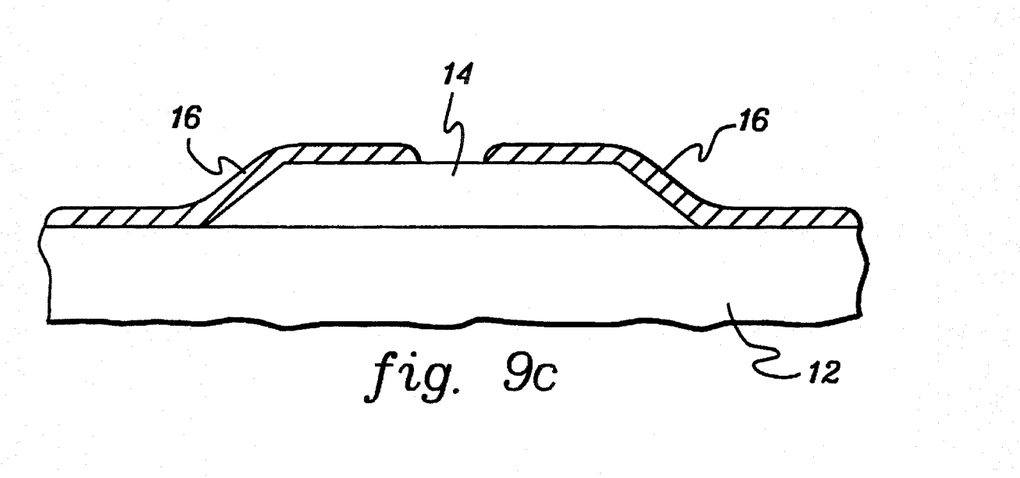
FIG. 9c is a partial elevational view of an integrated circuit chip with still another embodiment of transfer metal leads configured in accordance with the present invention, also formed from a sinusoidal metallization.

FIGS. 9a–9c depict other examples of tiered transverse cross-sectional configurations of transfer metal leads in accordance with this invention. In each embodiment, a sinusoidal metallization is formed in part by appropriately etching an insulator layer disposed above the integrated circuit chip. Etching or lift-off processing is then employed to define the resultant metal leads as shown. The cross-sectional configuration of FIG. 9b may be particularly advantageous in that depending upon the width of the overlay image, and the vertical extent of the transfer metal lead when viewed in transverse cross-section, the overlay image may expose only a central portion of the transfer metal lead. In such a case, a configuration such as presented in FIG. 9b would be advantageous in that more metal lead area would be exposed for greater current carrying capacity upon formation of an associated T-connect. Again, the embodiments of FIGS. 9a–9c merely represent additional cross-sectional configurations which may be employed to enhance contact probability with a subsequently formed metallization level on the cube face. As with the other embodiments, the configurations depicted in these figures may extend for the entire length of a transfer metal, or for only a portion thereof.

One embodiment of a transfer metal lead fabrication process in accordance with the present invention is next discussed with reference to the intermediate process structures of FIGS. 10a–10g Again, in accordance with this invention the exposed portion of the elongate conductor comprising the transfer metal lead will have a transverse cross-sectional configuration other than a standard rectangular configuration disposed parallel to the chip so that an enhanced vertical width is presented to facilitate electrical connection thereto without modifying the thickness of the conductive material itself. The structures presented herein can be fabricated by one skilled in the art using various existing techniques. The approach discussed herein below with reference to FIGS. 10a–10g is presented by way of example only.

Figure 10A:
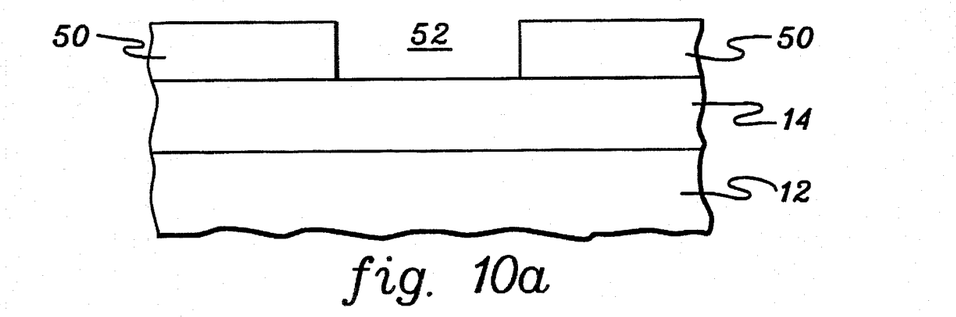
FIG. 10a is a partial elevational view of an intermediate structure, having resist and polyimide layers, useful in describing a fabrication method in accordance with the present invention.

The intermediate process structure of FIG. 10a comprises an integrated circuit chip 12 upon which a insulator 14 has been deposited, for example, during wafer processing. This layer need only be thick enough to prevent shorting of subsequently deposited transfer metal to any conductive structures on the wafer, including structures in the kerf region of the integrated circuit chip. This insulator layer may be at a contact level of the integrated circuit chip, a planarizing level, or simply an insulating level, and may vary in thickness from a few hundred angstroms to several microns. The insulator may comprise any suitable organic or inorganic insulating material, such as polyimide. In this description, it is assumed that the polyimide is deposited directly on the integrated circuit chip at the contact level. A photoresist 50 has been deposited on insulator 14 and patterned with an opening 52.

Figure 10B:
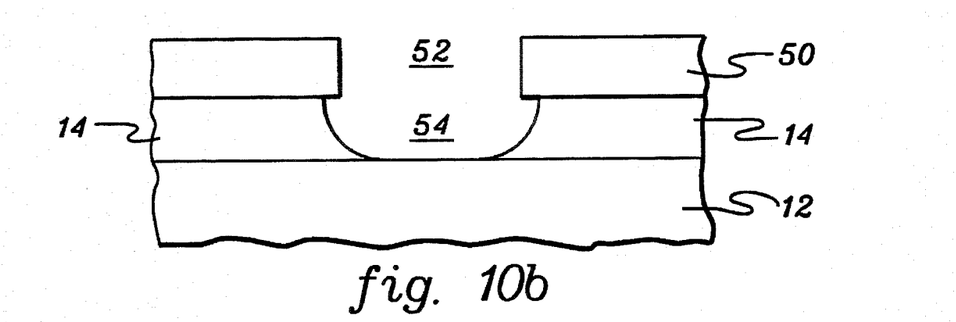
FIG. 10b is a partial elevational view of the structure of FIG. 10a subsequent to etching of the polyimide layer.

Etching of polyimide 14 can occur through opening 52 in a conventional manner to produce a channel 54 in layer 14 (FIG. 10b). In this regard, reference U.S. Pat. No. 5,173,392, entitled "Forming A Pattern On Substrate." In part, this patent discusses stability of the resist during the etch process. In particular, an explosive increase in the resist/polyimide image size can occur near the end point of the etch process. This can lead to electrical shorting defects, as well as to a restriction in the minimum image sizes attainable. This growth can be controlled by defining a minimum resist thickness and employing bake conditions prior to establishing the resist image on the polyimide. Such steps improve image uniformity within a wafer, and across a batch of wafers. Resist films of approximately 6 microns are believed preferential to establishing a stable image development. The polyimide thickness is not critical for the result attained. Films from 2.8 to 9 microns exhibit similar behavior. Baking of the polyimide before resist apply is also important for image stability.

Figure 10C:
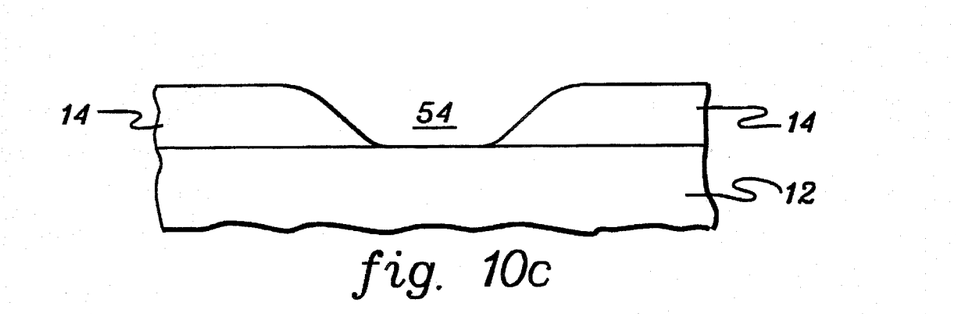
FIG. 10c is a partial elevational view of the structure of FIG. 10b subsequent to removal of the resist layer and curing of the polyimide.
Figure 10D:
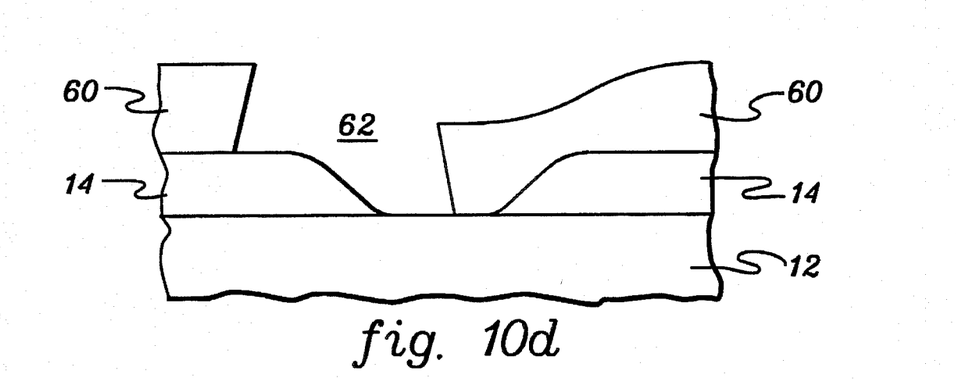
FIG. 10d is a partial elevational view of the structure of FIG. 10c subsequent to application and patterning of a negative resist.
Figure 10E:
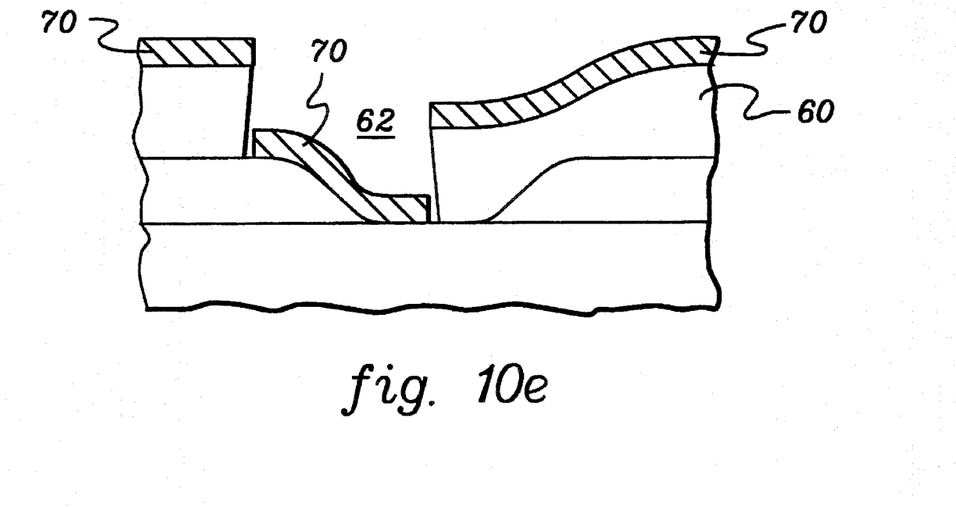
FIG. 10e is a partial elevational view of the structure of FIG. 10d subsequent to sputtering of a metal layer.
Figure 10F:
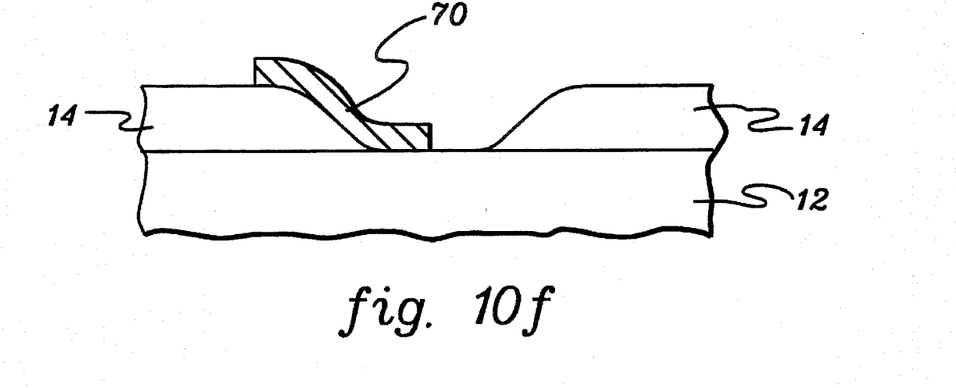
FIG. 10f is a partial elevational view of the structure of FIG. 10e subsequent to tape lift-off of unwanted metallization.
Figure 10G:
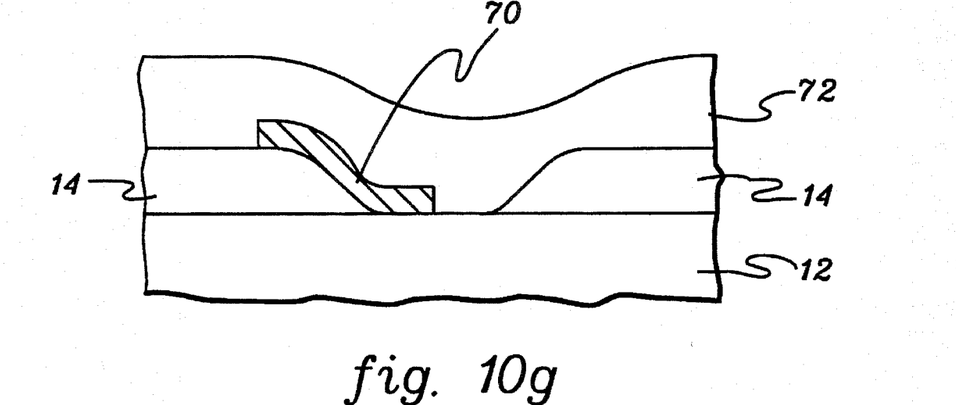
FIG. 10g is a partial elevational view of the structure of FIG. 10f subsequent to deposition of a polyimide layer above the transfer metal lead.

Continuing with the process, resist 50 is stripped from the structure and the polyimide undergoes further curing, for example, at 350° C., which results in the structure of FIG. 10c. A negative resist 60 is next applied and imaged to produce an opening 62 (FIG. 10d). This is followed by sputtering of metal, such as aluminum, onto the exposed surfaces of the structure (FIG. 10e). The undercut sidewalls of opening 62 form inherent discontinuities in the sputtered metal as shown in FIG. 10e. This process is referred to as a modified image reversal process and is described in U.S. Pat. No. 4,104,070 and in an IBM Technical Report by C. J. Hamel, entitled "Modified Image Reversal Process," No. 19.0494 (1980).

By stepping metal 70 over insulator 14, a sloped or Z-shaped transfer metal is approximated. A tape lift-off process to remove unwanted metal and the negative resist is followed by a solvent cleaning of the exposed surfaces, which results in the structure of FIG. 10f. A further layer of polyimide, i.e., layer 72, is applied and baked to produce the final structure shown in FIG. 10g. An integrated circuit chip is then formed by dicing the wafer, after which the cube structure can be produced by stacking and laminating multiple integrated circuit chips together such that the specially configured transfer metals align to a common face. As discussed above, it is possible to intersect the exposed transfer metal leads with a narrow opening with minimum alignment and overlay requirements. The tiered metal 70 can comprise any desired configuration, including a very gradual slope between tiers or, if desired, multiple steps of tiers. Further, if desired different transfer metal leads may have different transverse cross-sectional configurations depending, for example, upon the structure surrounding the transfer metal lead.

From the above discussion, those skilled in the art will note that a processing technique has been set forth that affects the configuration of transfer metal wiring in the kerf region to provide significant relaxation in via T-connect lithographic alignment, overlay and photoresist patterning requirements. The technique provides a general method for increasing the probability of intersecting two levels of metal without increasing the actual area of either metal level. Further, via T-connect to transfer metal wiring overlay probability is enhanced without increasing the actual thickness of the transfer metal.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. Electrical connect for an integrated circuit, said electrical connect comprising:

a unitary, elongate conductor, said unitary, elongate conductor being formed of a same material and including
   (i) a flat conductor portion disposed above an active region of the integrated circuit, and (ii) a vertically-enhanced conductor portion, said vertically-enhanced conductor portion having a transverse cross-sectional configuration with a vertical width greater than a vertical width of a transverse cross-sectional configuration of the flat conductor portion, wherein said flat conductor portion and said vertically-enhanced conductor portion are electrically connected together to form said unitary, elongate conductor formed of the same material, said vertically-enhanced conductor portion being disposed above a kerf region of the integrated circuit and facilitating electrical connection to said flat conductor portion disposed above the active region of the integrated circuit.

2. The electrical connect of claim 1, wherein said flat conductor portion is electrically connected to a portion of said active region of said integrated circuit.

3. The electrical connect of claim 2, wherein said integrated circuit comprises an integrated circuit chip, and wherein a via T-connect electrically connects said vertically-enhanced conductor portion disposed above the kerf region of the integrated circuit to a metal level on an edge of said integrated circuit chip.

4. The electrical connect of claim 1, wherein said unitary, elongate conductor comprises a conductive material of substantially constant thickness, and wherein said vertically-enhanced conductor portion disposed above the kerf region of the integrated circuit has a Z-shaped transverse cross-section.

5. The electrical connect of claim 1, wherein said elongate conductor resides within an insulator layer disposed above said integrated circuit, said insulator layer comprising polyimide, and wherein said unitary, elongate conductor formed of the some material comprises aluminum.

6. Electrical connect for an integrated circuit, said electrical connect comprising:
   a unitary, elongate conductor, said unitary, elongate conductor comprising a conductive material of substantially constant thickness, formed of a common material, and including
   (i) a first conductor portion of a first transverse cross-sectional configuration having a first horizontal width and a first vertical width, said first horizontal width being larger than said first vertical width,
   (ii) a second conductor portion of a second transverse cross-sectional configuration having a second horizontal width and a second vertical width, said second vertical width being greater than said first vertical width, said first conductor portion and said second conductor portion together comprising said unitary, elongate conductor, and
   (iii) wherein said first conductor portion is disposed over an active region of said integrated circuit and said second conductor portion is disposed over a kerf region of said integrated circuit, said second conductor portion facilitating electrical connection to said first conductor portion disposed over the active region of the integrated circuit.

7. The electrical connect of claim 6, wherein said first vertical width comprises said substantially constant thickness of said conductive material comprising said unitary, elongate conductor.

8. The electrical connect of claim 7, wherein said second horizontal width is larger than said second vertical width, and wherein said second horizontal width is approximately equal to said first horizontal width.

9. The electrical connect of claim 7, wherein said first horizontal width is larger than said second horizontal width.

10. The electrical connect of claim 6, wherein the first transverse cross-sectional configuration of said first conductor portion above the active region of the integrated circuit comprises a rectangular configuration, and wherein the second transverse cross-sectional configuration of said second conductor portion above the kerf region of the integrated circuit comprises a non-rectangular configuration.

11. The electrical connect of claim 10, wherein the non-rectangular configuration of the second conductor portion comprises a Z-shaped configuration.

12. The electrical connect of claim 6, wherein said unitary, elongate conductor is disposed within an insulator layer, said insulator layer comprising polyimide, and wherein the conductive material comprising said unitary, elongate conductor formed of the common material comprises aluminum.

13. Electrical connect for an integrated circuit, said electrical connect comprising a unitary, elongate conductor having a non-rectangular transverse cross-sectional configuration extending above a kerf region of the integrated circuit, said unitary elongate conductor being electrically coupled to an active region of said integrated circuit, said non-rectangular transverse cross-sectional configuration extending above the kerf region of the integrated circuit facilitating electrical connection to said unitary, elongated conductor.

14. The electrical connect of claim 13, wherein said non-rectangular transverse cross-sectional configuration comprises a Z-shaped configuration.

15. The electrical connect of claim 13, wherein said non-rectangular transverse cross-sectional configuration comprises an I-shaped configuration.

16. An integrated circuit chip comprising:
   an active integrated circuit region and an inactive integrated circuit region, said inactive integrated circuit region comprising a kerf region of said integrated circuit chip;
   an insulator layer disposed above said active integrated circuit region and said inactive integrated circuit region; and
   a transfer metal comprising a conductive material of substantially constant thickness, said transfer metal including:
   (i) a first conductor portion of a first transverse cross-sectional configuration having a first horizontal width and a first vertical width, said first horizontal width being larger than said first vertical width,
   (ii) a second conductor portion of a second transverse cross-sectional configuration having a second horizontal width and a second vertical width, said second vertical width being greater than said first vertical width, said first conductor portion and said second conductor portion together comprising said transfer metal, and
   (iii) wherein said first conductor portion is disposed over said active integrated circuit region and said second conductor portion is disposed over said kerf region of the integrated circuit chip, said second conductor portion facilitating electrical connection to said first conductor portion.

17. The integrated circuit chip of claim 16, wherein said second horizontal width is larger than said second vertical width, and said second horizontal width approximately equals said first horizontal width.

18. The integrated circuit chip of claim 17, wherein said first transverse cross-sectional configuration of said first conductor portion of said transfer metal comprises a rectangular-shaped configuration, and wherein said second transverse cross-sectional configuration of said second conductor portion of said transfer metal comprises a non-rectangular cross-sectional configuration.

19. The integrated circuit chip of claim 18, wherein the non-rectangular cross-sectional configuration of the second conductor portion comprises a Z-shaped configuration.

20. A semiconductor cube structure comprising:
   a plurality of integrated circuit chips, each integrated circuit chip comprising:
      an active integrated circuit region and an inactive integrated circuit region, said inactive integrated circuit region including a kerf region of said integrated circuit chip;
      an insulator layer disposed above said active integrated circuit region and said inactive integrated circuit region; and
      a plurality of transfer metals disposed within said insulator layer, each transfer metal including:
         (i) a first conductor portion of a first transverse cross-sectional configuration having a first horizontal width and a first vertical width, said first horizontal width being larger than said first vertical width,
         (ii) a second conductor portion of a second transverse cross-sectional configuration having a second horizontal width and a second vertical width, said second vertical width being greater than said first vertical width, said first conductor portion and said second conductor portion together comprising said transfer metal, and
         (iii) wherein said first conductor portion is disposed over said active integrated circuit region and wherein said second conductor portion is disposed over said kerf region of said integrated circuit chip, said second conductor portion facilitating electrical connection to said first conductor portion; and
   wherein said plurality of integrated circuit chips are arranged in a stack structure such that each integrated circuit chip is disposed adjacent to at least one other integrated circuit chip of the plurality of integrated circuit chips and such that at least some transfer metals of the plurality of transfer metals of each integrated circuit chip of said plurality of integrated circuit chips extend to a common face of said stack structure, and wherein the second conductor portion of each transfer metal extending to the common face intersects the common face such that said second transverse cross-sectional configuration of said second conductor portion over the kerf region is exposed.

21. The semiconductor cube structure of claim 20, further comprising a metal level disposed on said common face of said stack structure and connect means interconnecting the second conductor portions of the transfer metals extending to the common face with said metal level disposed thereon.

22. The semiconductor cube structure of claim 21, wherein said first transverse cross-sectional configuration of said first conductor portion of each transfer metal comprises a rectangular configuration, and wherein said second transverse cross-sectional configuration of said second conductor portion of each transfer metal comprises a non-rectangular configuration.

23. A semiconductor cube structure comprising:
   a plurality of integrated circuit chips, each integrated circuit chip comprising:
      an active integrated circuit region and an inactive integrated circuit region, said inactive integrated circuit region including a kerf region of said integrated circuit chip;
      an insulator layer disposed above said active integrated circuit region and said inactive integrated circuit region; and
      a plurality of transfer metals disposed within said insulator layer, each transfer metal comprising a unitary, elongate conductor having a vertically, enhanced transverse cross-sectional configuration over the kerf region of the integrated circuit chip, said unitary, elongate conductor being electrically coupled to an active region of said integrated circuit chip, said vertically-enhanced transverse cross-sectional configuration over the kerf region of the integrated circuit chip facilitating electrical connection to said transfer metal; and
   wherein said plurality of integrated circuit chips are arranged in a stack structure such that each integrated circuit chip is disposed adjacent to at least one other integrated circuit chip of the plurality of integrated circuit chips and such that at least some transfer metals of the plurality of transfer metals of each integrated circuit chip of said plurality of integrated circuit chips extend to a common face of said stack structure, and wherein said unitary, elongate structure of each transfer metal extending to the common face intersects the common face with said vertically-enhanced transverse cross-sectional configuration over the kerf region exposed.

\* \* \* \* \*

UNITED STATES PATENT AND TRADEMARK OFFICE
CERTIFICATE OF CORRECTION

PATENT NO. : 5,532,518  
DATED : July 2, 1996  
INVENTOR(S) : Hakey et al.

Page 1 of 3

It is certified that error appears in the above-indentified patent and that said Letters Patent is hereby corrected as shown below:

The Title page showing an illustrative figure should be deleted and substitute therefor the attached Title page.

In Sheet 1 of 6, delete "Fig. 2" and substitute therefor the new attached --Fig. 2--.

Signed and Sealed this

Twenty-fourth Day of December, 1996

Attest:

BRUCE LEHMAN

*Attesting Officer*      *Commissioner of Patents and Trademarks*

United States Patent [19]
Hakey et al.

[11] Patent Number: 5,532,518
[45] Date of Patent: Jul. 2, 1996

[54] ELECTRICAL CONNECT AND METHOD OF FABRICATION FOR SEMICONDUCTOR CUBE TECHNOLOGY

[75] Inventors: Mark C. Hakey, Milton; Steven J. Holmes, Burlington; John M. Wursthorn, Underhill Center, all of Vt.

[73] Assignee: International Business Machines Corporation, Armonk, N.Y.

[21] Appl. No.: 344,315

[22] Filed: Nov. 22, 1994

[51] Int. Cl.⁶ .................. H01L 23/48; H01L 23/52; H01L 29/40
[52] U.S. Cl. ........................... 257/774; 257/773
[58] Field of Search ........................ 257/774, 773

[56] References Cited

U.S. PATENT DOCUMENTS

| | | | |
|---|---|---|---|
| 4,912,288 | 3/1990 | Atkinson et al. | 174/251 |
| 4,933,743 | 6/1990 | Thomas et al. | 257/774 |
| 5,220,490 | 6/1993 | Weigler et al. | 361/409 |
| 5,288,235 | 2/1994 | Sobhani | 439/67 |
| 5,293,005 | 3/1994 | Yamamura | 174/251 |

FOREIGN PATENT DOCUMENTS

408597 of 1922 Germany.

*Primary Examiner*—Stephen D. Meier
*Attorney, Agent, or Firm*—Heslin & Rothenberg

[57] ABSTRACT

A transfer metal configuration and fabrication process possessing increased probability of intersecting a transverse metallization level are presented, without employing an increase in actual metal thickness. The transfer metal is configured with a non-rectangular transverse cross-section such that the thickness of the electrical connect remains the same, but the transverse contact area of the exposed metal is increased. The entire transfer metal may have the same transverse cross-sectional configuration or have portions with different transverse configurations. If different configurations are employed, each portion of the transfer metal to be transversely intersected has the enhanced cross-sectional configuration. A tiered transverse configuration is presented which facilitates electrical connection of the transfer metal to a metal level on a face of a semiconductor cube structure.

23 Claims, 6 Drawing Sheets fig. 2